United States Patent
Maskas et al.

[11] Patent Number: 5,287,517
[45] Date of Patent: Feb. 15, 1994

[54] SELF-COMPENSATING VOLTAGE LEVEL SHIFTING CIRCUIT

[75] Inventors: Barry A. Maskas, Sterling; Jeffrey A. Metzger, Leominster; George J. Harris, Framingham, all of Mass.

[73] Assignee: Digital Equipment Corporation, Maynard, Mass.

[21] Appl. No.: 874,322

[22] Filed: Apr. 24, 1992

[51] Int. Cl.⁵ .................................. H03K 19/003
[52] U.S. Cl. ............................ 307/475; 307/443
[58] Field of Search ............ 307/443, 451, 475, 310, 307/296.6

[56] References Cited

U.S. PATENT DOCUMENTS

| | | | |
|---|---|---|---|
| 4,656,375 | 4/1987 | Lauffer et al. | 307/443 X |
| 4,794,283 | 12/1988 | Allen et al. | 307/475 |
| 4,920,284 | 4/1990 | Denda | 307/475 |
| 4,929,852 | 5/1990 | Bae | 307/475 |
| 5,034,635 | 7/1991 | Ten Eyck | 307/475 |
| 5,115,434 | 5/1992 | Aizaki | 307/475 |

Primary Examiner—David R. Hudspeth
Attorney, Agent, or Firm—Kenyon & Kenyon

[57] ABSTRACT

The present invention is a circuit for converting the logic voltage levels from those of a first device to those of a second device. This conversion is accomplished while substantially isolating the second device from the effects of the first device that could influence the outputs of the second device that represent the converted logic level voltages.

29 Claims, 3 Drawing Sheets

SELF-COMPENSATING VOLTAGE LEVEL SHIFTING CIRCUIT

FIELD OF THE INVENTION

The present invention relates to circuits that are used to change the logic levels from those useful of one family of devices to those useful of another family of devices to effect communication between devices of these two families.

BACKGROUND OF THE INVENTION

Modern electronic systems often operate using digital logic. Digital logic is usually characterized by two distinct states which represent a Boolean one and a Boolean zero. However, since there are many different families of electronic devices, each family, or group of families, may define the two logic states at different voltage levels.

For example, a device from a first family may operate with a logic "1" value represented by a 3.2 volt level and a logic "0" value represented by a 0 volt level. The voltage difference between the two signals is the voltage swing, which in this case is 3.2 volts. A device from a second family, on the other hand, may operate with a logic "1" value represented by a 2.4 volt level and a logic "0" value represented by a 1.6 volt level. The voltage swing in this case is 0.8 volts.

There are many situations in which the first device with logic levels of 3.2 volts and 0 volts must communicate with the second device with logic levels of 2.4 volts and 1.6 volts. To do this, the logic levels for one device must be converted to the logic levels of the other device.

If a first device of a first family is considered device A and a second device of a second family is device B, and device A is to communicate with device B, it is necessary to convert the logic levels for device A to those for device B. Therefore, for device A to have its logic signals accepted by device B, its logic "1" value with a 3.2 volt level must be converted down to a 2.4 volt level, and the logic "0" value with a 0 volt level must be converted up to a 1.6 volt level. These conversions will provide the proper logic levels and voltage swing. As such, the voltage swing must be attenuated by 4 from 3.2 volts to 0.8 volts, and the level shifted up by 1.6 v.

Device A's logic "1" value and logic "0" value voltage levels are converted according to the expression:

$$\frac{(a)}{(4)} + 1.6 = \text{converted logic level} \quad (1)$$

where, a=Device A's logic "1" value level of 3.2 volts or logic "0" level of 0 volts.

According to expression (1), the 3.2 volts will convert to 2.4 volts, and the 0 volts will convert to 1.6 volts. A circuit with a network of resistors is used to do this. Such a circuit attenuates the voltage swing, and performs level shifting through the use of a power supply. Accordingly, the converted logic levels are a function of the power supplies driving devices A and B, as well as the signal level generated by device B.

Referring to FIG. 1, a prior art voltage level shifting circuit is shown generally at 1. Device A 2 has a logic "1" value with a 3.2 volt level and a logic "0" value with a 0 volt level. Device B 30 has a logic "1" value with a 2.4 volt level and a logic "0" value with a 1.6 volt level. The portion of the circuit of the present invention in device A 2 has an open source output stage 3. Open source output stage 3 may be a P-channel field effect transistor ("FET"), such as FET 16. Assuming that it is desirable for device A to communicate with device B, the circuit of FIG. 1 will convert the logic levels and permit this communication. To perform the conversion, the voltage level to be converted is input at input 4. Assuming that the first input at input 4 is logic high, 3.2 volts, FET 6, which has a negative/true gate input, will not conduct. However, when the 3.2 volts is applied to the gate input of FET 8, it will conduct.

When FET 8 conducts, line 14 which connects to the gate input of FET 16 (at open source output stage 3) connects to ground 12. Since line 14 now connects to ground 12, the gate input of FET 16 is pulled to 0 volts. The gate input of FET 16 is negative/true, so FET 16 will conduct. When FET 16 conducts, the supply voltage at 10, 3.2 volts, is supplied to R1 resistor 20 which is disposed between the device A 2 and device B 30.

At device B 30, the supply voltage at 32, 1.6 volts, is input to R2 resistor 44. As stated, FET 16 is conducting, so the supply voltage at 10, 3.2 volts, is applied to R1 resistor 20. Now, the voltage contribution from device A must be determined to see if the proper conversion is taking place when FET 16 is conducting.

When FET 16 is conducting, current $I_a$ flows through R1 resistor 20 and R2 resistor 44. Therefore, current $I_a$ is determined by the expression:

$$I_a = \frac{V}{R} = \frac{(3.2 - 1.6 \text{ volts})}{50 \, \Omega \, (R1) + 50 \, \Omega \, (R2)} = 16 \text{ ma} \quad (2)$$

The 16 ma of current flowing through R2 resistor 44 will produce a voltage drop according to the expression:

$$V = IR = (16 \text{ ma})(50 \, \Omega) = 0.8 \text{ volts} \quad (3)$$

Therefore, at $V_b$ 46, the voltage is 1.6 volts + 0.8 volts = 2.4 volts. Accordingly, the conversion from the 3.2 volt logic high of device A to 2.4 volts logic high of device B is confirmed.

In the situation when a logic low of 0 volts is applied at input 4 at device A 2, FET 6 will conduct and FET 8 will not conduct. When FET 6 conducts, the supply voltage at 10, 3.2 volts, is supplied to line 14. This applies a logic high to the negative/true gate input to FET 16. Since the gate input is a negative/true, a logic low will be applied to FET 16 and FET 16 will not conduct. If FET 16 does not conduct, device A 2 will not make any voltage contribution at $V_b$ 46 and the voltage at this point is only the 1.6 volts provided by supply 32. Hence, when input at input 4 of device A 2 is a logic low of 0 volts, the valid output at 50 is 1.6 volts which is the logic low for device B 30.

The disadvantages of using the prior art circuit shown in FIG. 1 for carrying out the conversion function is its dependence of the output voltage levels of both power supplies 10 and 32, and the fact that as the ambient temperature and power supply of device B change, the signal levels and voltage thresholds of device B do not generally track these changes in the power supply voltages.

The present invention provides a circuit that overcomes these and other problems as will be set forth in the remainder of the specification referring to the drawings.

SUMMARY OF THE INVENTION

The present invention is a circuit for converting the logic level voltages from those of a first device to those of a second device. This is done while substantially isolating the second device from the effects of the power supply of the first device which could influence the reliability of the outputs of the second device that represent the converted logic levels.

According to the first embodiment of the present invention, a device A, whose logic level signals are to be converted, has a first portion of the circuit of the present invention and this portion is used to trigger the operation of the second portion of the circuit of the present invention that resides in device B. The second portion of the circuit generates the converted logic level signals.

When a low logic level is asserted in device A, the portion of the circuit in device B causes a low logic level to be asserted in device B at the converted level. When a high logic level is asserted in device A, the portion of the circuit in device B causes a high logic level to be asserted in device B also at the converted level. The conversion of the logic signals is accomplished while partially isolating the device B from the temperature and voltage induced signal shifts of device A.

In a second embodiment of the circuit of the present invention, the first portion, the triggering portion, resides in device A, and the second portion, the converted level generating portion, resides in device B. This second portion includes a first section and a second section. The first section generates a steady high level voltage. The second section of the portion of the circuit of the present invention in device B generates a steady low level voltage. Accordingly, the logic high and low levels of the device A are converted to the logic high and low levels of the device B. The conversion of the logic signals is accomplished while isolating the device B from the temperature and voltage induced signal shifts of device A.

The present invention will be disclosed in detail in the remainder of the specification, referring to the drawings.

DETAILED DESCRIPTION OF THE INVENTION

Figure 1:
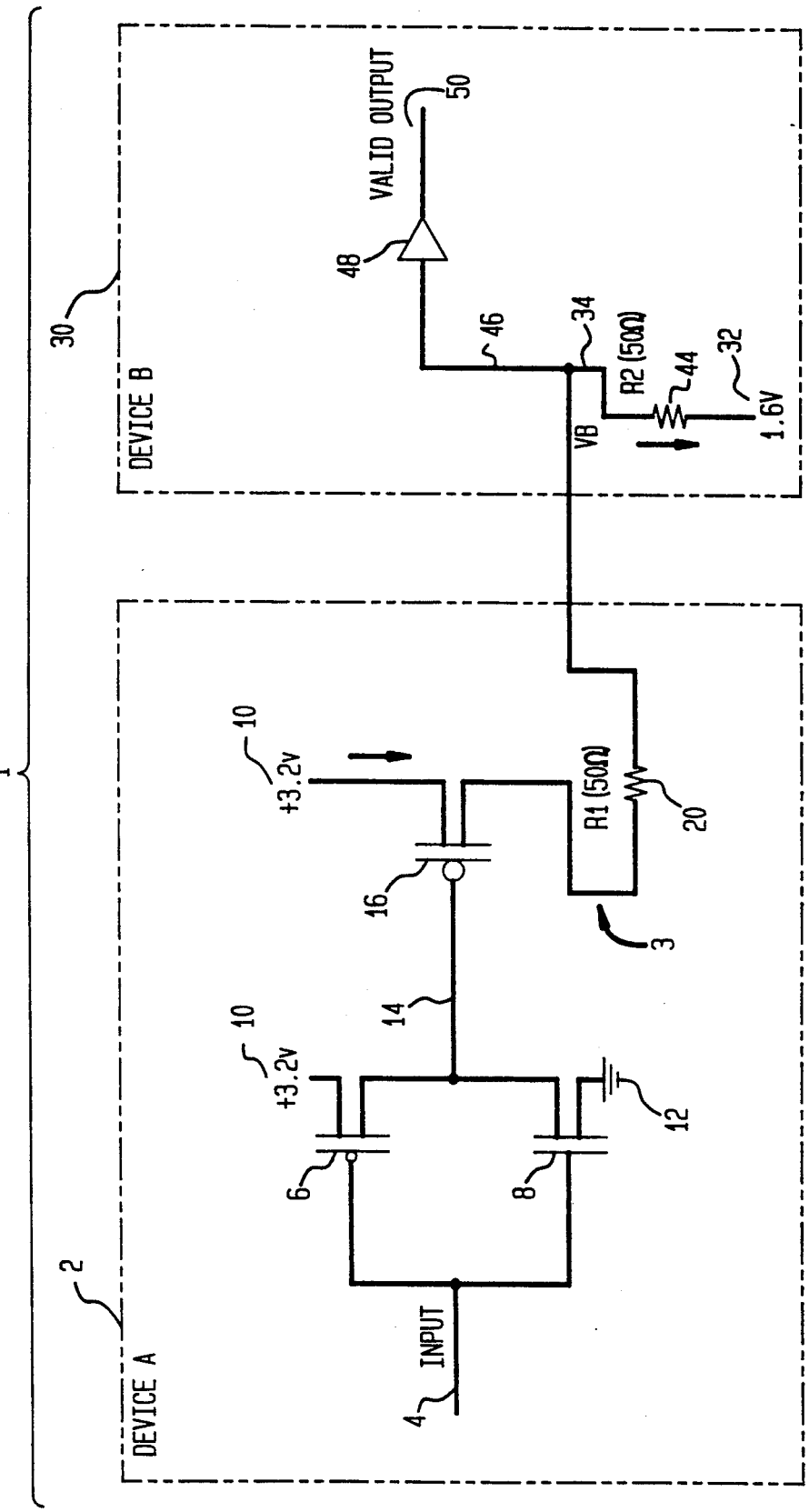
FIG. 1 is a prior art circuit for converting logic level voltages from the levels for one device to the levels for a second device.
Figure 2:
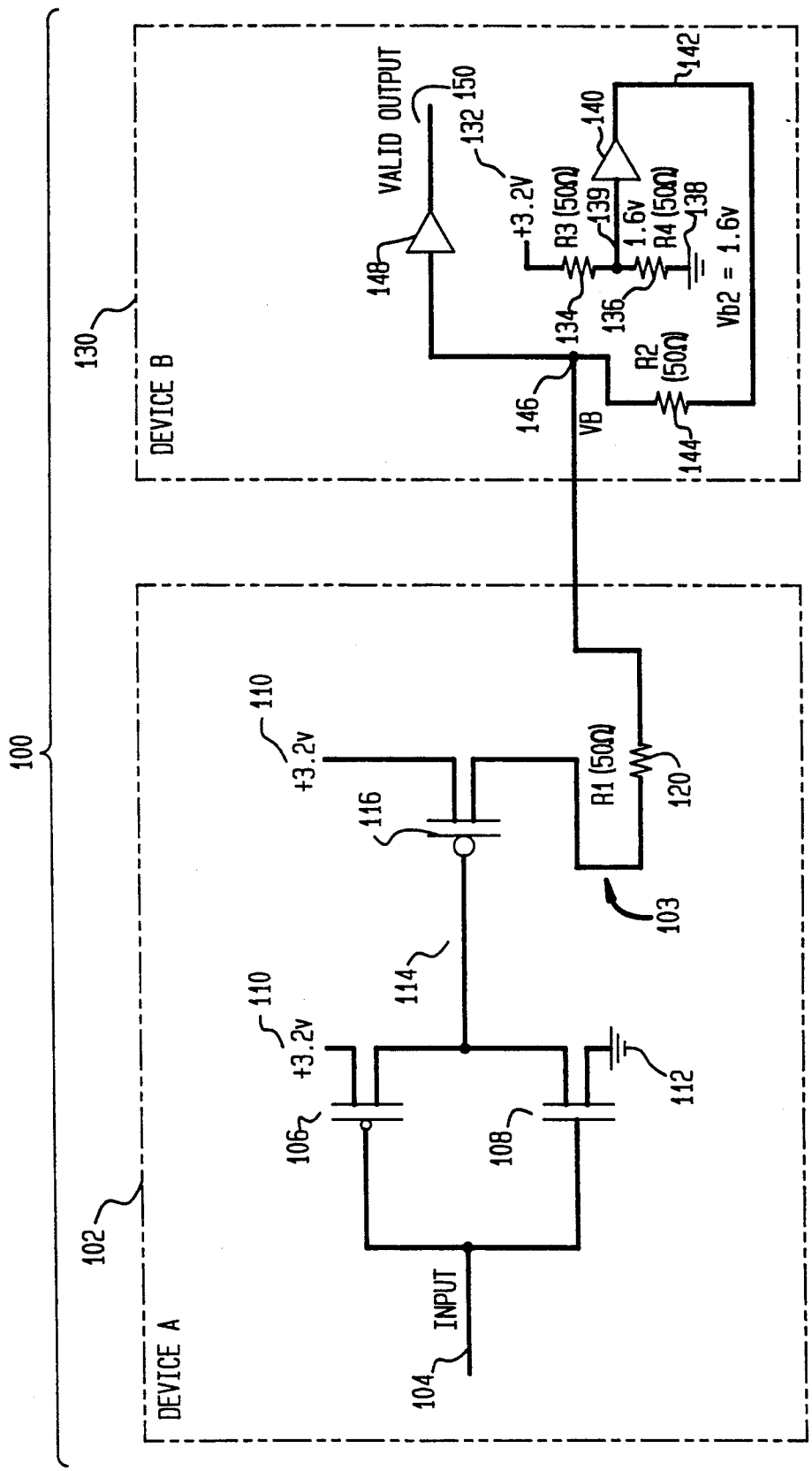
FIG. 2 is a first embodiment of the present invention for converting logic level voltages from the levels for one device to the levels for a second device.

Referring now to FIG. 2, the circuit of the first embodiment of the present invention is shown generally at 100.

Device A 102 has a logic "1" value with a 3.2 volt level and a logic "0" value with a 0 volt level. Device B 130 has a logic "1" value with a 2.4 volt level and a logic "0" value with a 1.6 volt level. The portion of the circuit of the present invention in device A 102 has an open source output stage 103. Open source output stage 103 may be a P-channel field effect transistor ("FET"), such as FET 116. Assuming that it is desirable for device A to communicate with device B, the circuit of FIG. 2 will convert the logic levels and permit this communication. To perform the conversion, the voltage level to be converted is input at input 104. Assuming that the first input at input 104 is logic high, 3.2 volts, FET 106, which has a negative/true gate input, will not conduct. However, when the 3.2 volts is applied to the gate input of FET 108, it will conduct.

When FET 108 conducts, line 114 which connects to the gate input of FET 116 (at open source output stage 103) connects to ground 112. Since line 114 now connects to ground 112, the gate input of FET 116 is pulled to 0 volts. The gate input of FET 116 is negative/true, so FET 116 will conduct. When FET 116 conducts, the supply voltage at 110, 3.2 volts, is supplied to R1 resistor 120 which is disposed between the device B 102 and device B 130.

At device B 130, supply voltage at 132, 3.2 volts, is input to a voltage divider consisting of R3 resistor 134 and R4 resistor 136. The voltage divider connects to ground 138. Line 139 connects to the voltage divider between the R3 and R4 resistors. The R3 and R4 resistors are both 50 Ω resistors. Therefore, the voltage on line 139 where it connects to the voltage divider is 1.6 volts. This 1.6 volts is applied to buffer 140. The buffer processes the 1.6 volts and then provides it to line 142. The 1.6 volts is the required voltage shift.

As stated, FET 116 is conducting, so the supply voltage at 110, 3.2 volts, is applied to R1 resistor 50. Now, the voltage contribution from device A must be determined to see if the proper conversion is taking place when FET 116 is conducting.

When FET 116 is conducting, current $I_a$ flows through R1 resistor 120 and R2 resistor 144. Therefore, current $I_a$ is determined by expression (2) above. The result is current $I^a$ equals 16 ma. The 16 ma of current flowing through R2 resistor 144 will produce a voltage drop according to expression (3) above. This value is 0.8 volts. Therefore, at $V_b$ 146, the voltage is 1.6 volts +0.8 volts = 2.4 volts. Accordingly, the conversion from the 3.2 volt logic high of device A to 2.4 volts logic high of device B is confirmed.

In the situation when a logic low of 0 volts is applied at input 104 at device A 102, FET 106 will conduct and FET 108 will not conduct. When FET 106 conducts, the supply voltage at 110, 3.2 volts, is supplied to line 114. This applies a logic high to the negative/true gate input to FET 116. Since the gate input is a negative/true, a logic low will be applied to FET 116 and FET 116 will not conduct. If FET 116 does not conduct, device A 102 will not make any voltage contribution at $V_b$ 146 and the voltage at this point is only the 1.6 volts provided by line 142. Hence, when input at input 104 of device A 102 is a logic low of 0 volts, the valid output at 150 is 1.6 volts which is the logic low for device B 130.

With respect to the first embodiment of the present invention as shown in FIG. 2, device B 130 is partially isolated from the variations in the power supply of device A 102 such that only the converted high level may be affected by these variations. The generation of the converted low level value, however, is based on the circuit that includes the voltage divider and buffer 140 which naturally supply the proper baseline/converted low level value.

Figure 3:
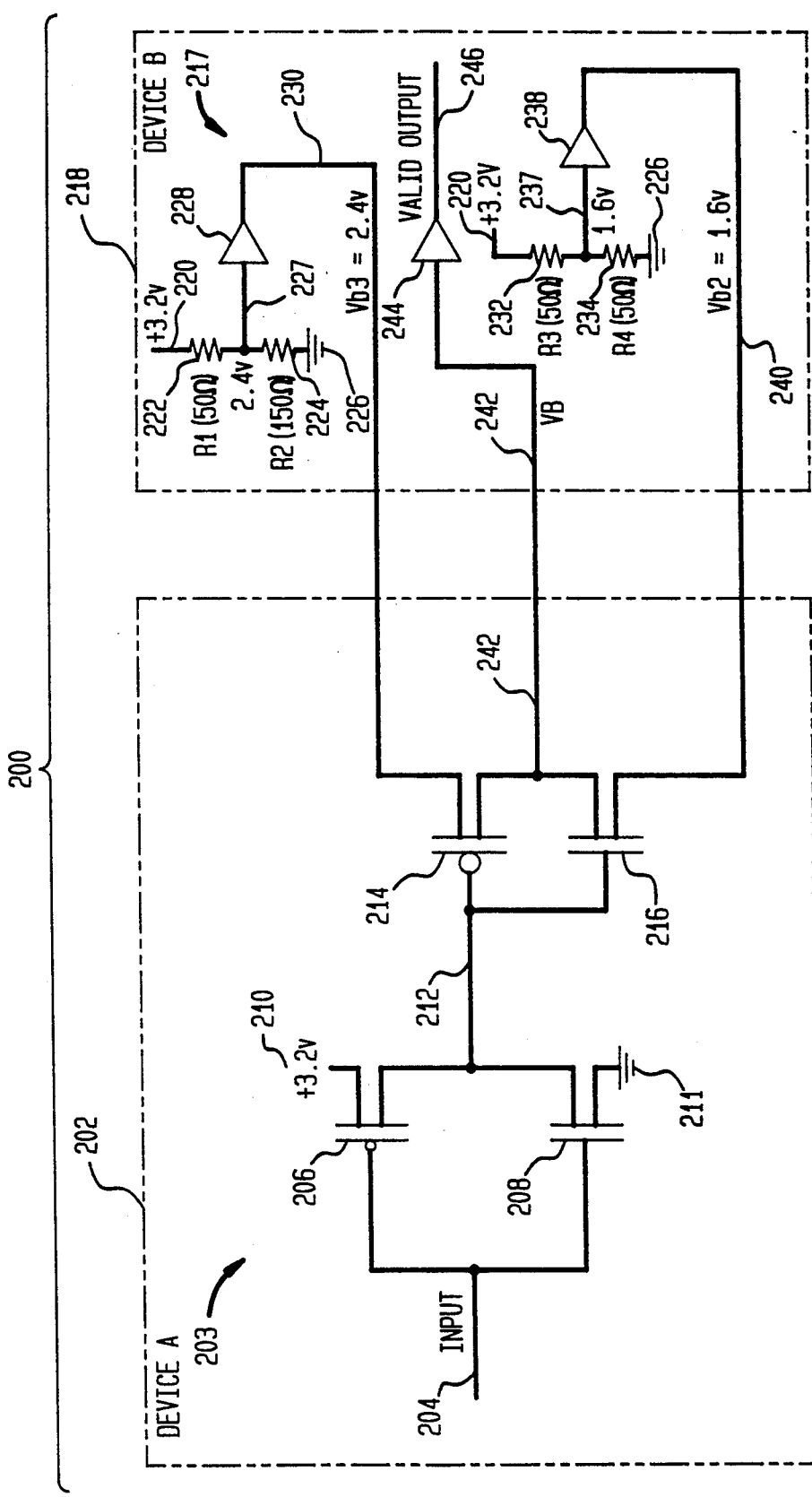
FIG. 3 is a second embodiment of the present invention for converting logic level voltages from the levels for one device to the levels for a second device.

Referring now to FIG. 3, the circuit of the second embodiment present invention is shown generally at 200. The circuit has a first portion 203 in device A 202 and a second portion 217 in device B 218. The circuit of the present invention is used when it is desired to communicate between device A 202 and device B 218, and the two devices operate at different logic level voltages. Accordingly, it is necessary to convert the logic levels suitable for device A 202 to those suitable for device B 218. As will be shown, the portion in device A is used to trigger the portion in device B.

By way of example, device A 202 has a logic high level of 3.2 volts and a logic low level of 0 volts, and device B 218 has a logic high level of 2.4 volts and a logic low level of 1.6 volts. First the conversion of the logic high will be described, then the conversion of a logic low will be described. It is to be noted that device A 202 acts as a trigger portion of the circuit of the present invention while the portion in device B 218 generates the converted logic level voltages based on trigger signals.

When a logic high of 3.2 volts for device A 214 is asserted at input 204, it is input to the gate inputs of FETs 206 and 208. The logic high input at the negative/true gate input FET 206 will result in this FET not conducting. However, when the logic high is input to the gate input of FET 208, it will conduct, and line 212 will connect to ground 211.

Line 212 connects to the gate input of FETs 204 and 216. When line 212 is at a logic low level, FET 214 will conduct because it has a negative/true gate input. This is not the case with regard to FET 216, so when a logic low is input to its gate input, it will not conduct.

When FET 214 conducts, line 230 connects to line 242. Therefore, whatever voltage is on line 230, it will be provided to valid output 246 via line 242 and buffer 244.

The voltage on line 230 is determined by the voltage divider that has R1 resistor 222 and R2 resistor 224 that are connected in series between the supply voltage at 220, 3.2 volts, and ground 226. R1 resistor 222 may be a 50 Ω resistor and R2 resistor 224 may be a 150 Ω resistor. Line 227 is connected between the R1 and R2 resistors. Based on the resistor values of the R1 and R2 resistors, the voltage on line 227 is 2.4 volts. This voltage is processed by buffer 228 and placed on line 230. Therefore, when FET 214 conducts, the 2.4 volt signal on line 230 is presented at valid output 246. This, therefore, is the conversion of the logic high level of 3.2 volts in device A 202 to the logic high level of 2.4 volts in device B 218.

When a logic low of 0 volts is asserted at input 204 of device A 202, it is input to the gate inputs of FETs 206 and 208. FET 208 will not conduct with a logic low at its gate input. However, this logic low at the negative/true gate input of FET 206 will cause FET 206 to conduct and supply voltage at 210, 3.2 volts, will be provided to line 212.

Line 212 connects to the inputs to FETs 214 and 216. The gate input of FET 214 is a negative/true input so FET 214 will not conduct when the 3.2 volt supply voltage is supplied to the gate input of this FET. On the other hand, when the 3.2 volt supply voltage is supplied to the gate input of FET 216, this FET will conduct. This connects the voltage on line 240 to line 242. Line 242 through buffer 244 connects to valid output 246.

The voltage on line 240 is determined by the voltage divider consisting of R3 resistor 232, which may be a 50 Ω resistor, and R4 resistor 234, which also may be a 50 Ω resistor. The voltage divider is connected between the supply voltage at 220, 3.2 volts, and ground 226. Line 237 connects between the R3 and R4 resistors and, based on the resistor values, the voltage on line 237 is 1.6 volts. This voltage is processed by buffer 238 and supplied to line 240.

When FET 216 is conducting, the 1.6 volt voltage is supplied to the line 242 and buffer 244, and presented as the output voltage at valid output 246. Accordingly, the 1.6 volts at valid output 246 is the conversion of device A 202 logic low level to device B 218 logic low level.

As can be seen with respect to the circuit of the present invention that is shown in FIG. 3 at 200, the power supply of device A 202 does not contribute to the voltage levels of the converted signals. Accordingly, device B 218 is isolated from the voltage induced signal shifts of device A 202.

The terms and expressions which are employed herein are used as terms of expression and not of limitation. And, there is no intention, in the use of such terms and expressions, of excluding the equivalents of the features shown, and described, or portions thereof, it being recognized that various modifications are possible within the scope of the invention.

What is claimed is:

1. A voltage level shifting circuit, comprising:

a trigger portion that provides a first trigger signal when a first voltage level to be shifted is input to the trigger portion and provides a second trigger signal when a second voltage level to be shifted is input to the trigger portion;

a shifted voltage level generating portion that further includes a first section that is responsive to the first trigger signal such that when the first trigger signal is asserted, the first section generates a first shifted voltage level that is output from the circuit and a second section that is responsive to the second trigger signal such that when the second trigger signal is asserted, the second section generates a second shifted voltage level that is output from the circuit;

the trigger portion further including:

input means;

first switch means that is connected to the input means, the first switch means for providing a first signal to a first line when the second voltage level is input at the input means;

second switch means that is connected to the input means, the second switch means for providing a second signal to the first line when the first voltage level is input at the input means;

third switch means that is connected to the first line, the third switch means for connecting first voltage supplying means to a circuit output, the first voltage supplying means and the circuit output being disposed in the shifted voltage level generating portion of the circuit, for providing a first shifted voltage level at the circuit output; and fourth switch means that is connected to the first line, the fourth switch means for connecting second voltage supplying means to the circuit output, the second voltage supplying means being disposed in the shifted voltage level generating portion of the circuit, for providing a second shifted voltage level at the circuit output.

2. The circuit as recited in claim 1, wherein the trigger portion is disposed in a first system that operates using the first and second voltage levels.

3. The circuit as recited in claim 1 wherein each of the first, second, third, and fourth switch means includes a field effect transistor.

4. The circuit as recited in claim 1, wherein the shifted voltage level generating portion is disposed in a second system that operates using the first and second shifted voltage levels.

5. The circuit as recited in claim 4, wherein the shifted voltage level generating portion comprises:
first voltage supplying means for providing a first shifted voltage level to a second line, with the second line being connected to the trigger portion;
second voltage supplying means for providing a second shifted voltage level to a third line, with the third line being connected to the trigger portion; and
circuit output means that is connected to the second and third lines through the trigger portion.

6. The circuit as recited in claim 5, wherein each of the first and second voltage supplying means includes a voltage divider for providing first and second shifted voltage levels, respectively.

7. The circuit as recited in claim 1, wherein the trigger portion is disposed in a first system that operates using the first and second voltage levels and the shifted voltage level generating portion is disposed in a second system that operates using the first and second shifted voltage levels.

8. A voltage level shifting circuit, comprising:
a trigger portion that provides a first trigger signal when a first voltage level to be shifted is input to the trigger portion and provides a second trigger signal when a second voltage level to be shifted is input to the trigger portion;
a shifted voltage level generating portion that further includes a first section that is responsive to the first trigger signal such that when the first trigger signal is asserted, the first second generates a first shifted voltage level that is output from the circuit and a second section that is responsive to the second trigger signal such that when the second trigger signal is asserted, the second section generates a second shifted voltage level that is output from the circuit;
the shifted voltage level generating portion further including:
first voltage supplying means for providing a first shifted voltage level to a second line, with the second line being connected to the trigger portion; and
second voltage supplying means for providing a second shifted voltage level to a third line, with the third line being connected to the trigger portion; and
circuit output means that is connected to the second and third lines through the trigger portion.

9. The circuit as recited in claim 8, wherein each of the first and second voltage supplying means includes a voltage divider for providing first and second shifted voltage levels, respectively.

10. A voltage level shifting circuit, comprising:
input means;
first switch means that is connected to the input means, the first switch means for providing a first signal to a first line when a second voltage level is input at the input means;
second switch means that is connected to the input means, the second switch means for providing a second signal to the first line when a first voltage level is input at the input means;
first voltage supplying means for providing a first shifted voltage level to a second line;
second voltage supplying means for providing a second shifted voltage level to a third line;
third switch means that is connected to the first line, the third switch means for connecting the second line, with the first shifted voltage level thereon, to a circuit output when the second signal is provided to the first line; and
fourth switch means that is connected to the first line, the fourth switch means for connecting the third line, with the second shifted voltage level thereon, to the circuit output when the first signal is provided to the first line.

11. The circuit as recited in claim 10, wherein each of the first, second, third, and fourth switch means includes a field effect transistor.

12. The circuit as recited in claim 10, wherein each of the first and second voltage supplying means includes a voltage divider for providing first and second shifted voltage levels, respectively.

13. A voltage level shifting circuit, comprising:
input means;
first voltage supplying means for providing a first shifted voltage level to a second line;
second voltage supplying means for providing a second shifted voltage level to a third line;
a trigger portion of the circuit including:
first switch means that is connected to the input means, the first switch means for providing a first signal to a first line when a second voltage level is input at the input means and a second signal to the first line when a first voltage level is input at the input means; and
second switch means that is connected to the first line, the second switch means for connecting the second line, with the first shifted voltage level thereon, to a circuit output when the second signal is provided to the first line and for connecting the third line, with the second shifted voltage level thereon, to the circuit output when the first signal is provided to the first line.

14. The circuit as recited in claim 13, wherein the first switch means further comprises:
a first switch device that is connected to the input means, the first switch device for providing the first signal to the first line when the second voltage level is input at the input means; and
a second switch device that is connected to the input means, the second switch device for providing the second signal to the first line when the first voltage level is input at the input means.

15. The circuit as recited in claim 14, wherein each of the first and second switch devices includes a field effect transistor.

16. The circuit as recited in claim 14, wherein the second switch means further comprises:
a third switch device that is connected to the first line, the third switch device for connecting the second line, with the first shifted voltage level thereon, to a circuit output when the second signal is provided to the first line; and a fourth switch device that is connected to the first line, the fourth switch device for connecting the third line, with the second shifted volt thereon, to the circuit output when the first signal is provided to the first line.

17. The circuit as recited in claim 16, wherein each of the third and fourth switch devices includes a field effect transistor.

18. The circuit as recited in claim 14, wherein the trigger portion of the circuit is disposed in a first system that operates using the first and second voltage levels.

19. The circuit as recited in claim 13, wherein the first and second voltage supplying means are a shifted voltage level generating portion of the circuit.

20. The circuit as recited in claim 19, wherein each of the first and second voltage supplying means includes a voltage divider for providing first and second shifted voltage levels, respectively.

21. The circuit as recited in claim 19, wherein the shifted voltage level generating portion is disposed in a second system that operates using the first and second shifted voltage levels.

22. A voltage level shifting circuit, comprising:
a trigger portion that provides a first trigger signal when a first voltage level to be shifted is input to the trigger portion and provides a second trigger signal when a second voltage level to be shifted is input to the trigger portion;
a shifted voltage level generating portion that further includes a first section that is responsive to the first trigger signal such that when the first trigger signal is asserted, the first section generates a first shifted voltage level that is output from the circuit and a second section that is responsive to the second trigger signal such that when the second trigger signal is asserted, the second section generates a second shifted voltage level that is output from the circuit;
the trigger portion further including:
input means;
first switch means that is connected to the input means, the first switch means for providing a first signal to a first line when the second voltage level is input at the input means;
second switch means that is connected to the input means, the second switch means for providing a second signal to the first line when the first voltage level is input at the input means; and
third switch means that is connected to the first line, the third switch means for connecting first voltage supplying means to a circuit output, the first voltage supplying means being disposed in the trigger portion and the circuit output being disposed in the shifted voltage level generating portion of the circuit, for providing a first shifted voltage level at the circuit output, the third switch means that is connected to the first line, the third switch means further for connecting second voltage supplying means to the circuit output, the second voltage supplying means being disposed in the shifted voltage level generating portion of the circuit, for providing a second shifted voltage level at the circuit output.

23. The circuit as recited in claim 22, wherein each of the first, second, and third switch means includes a field effect transistor.

24. The circuit as recited in claim 23, wherein the shifted voltage level generating portion is disposed in a second system that operates using the first and second shifted voltage levels.

25. The circuit as recited in claim 24, wherein the shifted voltage level generating portion comprises:
circuit output means that is connected to the first voltage supplying means through the third switch means, first voltage supplying means providing the first shifted voltage level to the circuit output; and
second voltage supplying means for providing a second shifted voltage level to a second line, with the second line being connected to the trigger portion.

26. The circuit as recited in claim 25, wherein each of the first and second voltage supplying means includes a voltage divider for providing first and second shifted voltage levels, respectively.

27. The circuit as recited in claim 22, wherein the trigger portion is disposed in a first system that operates using the first and second voltage levels and the shifted voltage level generating portion is disposed in a second system that operates using the first and second shifted voltage levels.

28. A voltage level shifting circuit, comprising:
a trigger portion that provides a first trigger signal when a first voltage level to be shifted is input to the trigger portion and provides a second trigger signal when a second voltage level to be shifted is input to the trigger portion; and
a shifted voltage level generating portion that further includes a first section that is responsive to the first trigger signal such that when the first trigger signal is asserted, the first section generates a first shifted voltage level that is output from the circuit and a second section that is responsive to the second trigger signal such that when the second trigger signal is asserted, the second section generates a second shifted voltage level that is output from the circuit;
the trigger portion further including:
input means;
first switch means that is coupled to the input means, the first switch means for connecting first voltage supplying means to a circuit output, the first voltage supplying means and the circuit output being disposed in the shifted voltage level generating portion of the circuit, for providing a first shifted voltage level at the circuit output; and
second switch means that is coupled to the input means, the second switch means for connecting second voltage supplying means to the circuit output, the second voltage supplying means being disposed in the shifted voltage level generating portion of the circuit, for providing a second shifted voltage level at the circuit output.

29. The circuit as recited in claim 28, wherein each of the first and second switch means includes a field effect transistor.

* * * * *